US010530338B2

(12) United States Patent
Maruyama et al.

(10) Patent No.: US 10,530,338 B2
(45) Date of Patent: Jan. 7, 2020

(54) PHASE SHIFT PRECISION CALIBRATION CIRCUITRY, VECTOR SUM PHASE SHIFTER, AND WIRELESS COMMUNICATION DEVICE (71) Applicant: Mitsubishi Electric Corporation, Tokyo (JP)

(72) Inventors: Takaya Maruyama, Tokyo (JP); Eiji Taniguchi, Tokyo (JP); Takanobu Fujiwara, Tokyo (JP); Koji Tsutsumi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 91 days.

(21) Appl. No.: 15/779,286

(22) PCT Filed: Mar. 2, 2016

(86) PCT No.: PCT/JP2016/056429
§ 371 (c)(1),
(2) Date: May 25, 2018

(87) PCT Pub. No.: WO2017/149699
PCT Pub. Date: Sep. 8, 2017

(65) Prior Publication Data
US 2018/0323771 A1    Nov. 8, 2018

(51) Int. Cl.
*H03H 11/20*  (2006.01)
*H03F 3/195*  (2006.01)
(Continued)

(52) U.S. Cl.
CPC ........... *H03H 11/20* (2013.01); *H03F 1/3282* (2013.01); *H03F 3/195* (2013.01); *H03F 3/211* (2013.01);
(Continued)

(58) Field of Classification Search
CPC ...... H03H 11/16; H03H 11/20; H03F 1/3282; H03F 1/3288; H03F 2200/336;
(Continued)

(56) References Cited

U.S. PATENT DOCUMENTS 7,126,510 B2 * 10/2006 Alon .................. H03M 1/1023
                                                     341/120
9,602,184 B2 *  3/2017 Honda .................... H01Q 3/26
(Continued)

OTHER PUBLICATIONS

Zeng et al. "Full 360 Vector-Sum Phase-Shifter for Microwave System Applications", Circuits and Systems I: Regular Papers, IEEE Transactions, May 2010 (Year: 2010).*

(Continued)

*Primary Examiner* — Peter M Bythrow
(74) *Attorney, Agent, or Firm* — Birch, Stewart, Kolasch & Birch, LLP (57) ABSTRACT

There are provided: a table memory to store a relation between a control code and gains of variable gain amplifiers; a gain controller to apply the gains to the variable gain amplifiers; an amplitude phase detector to detect amplitude and a phase from an output signal of the vector sum phase shifter; an amplitude phase recorder to record, when the gains are applied by the gain controller, a combination of a control code corresponding to said gains and the amplitude and the phase detected by the detector; and a table calibrator to find a phase shift characteristic of a vector summed part from records of the amplitude phase recorder and calibrate the relation between a control code and gains recorded in the table memory by using the phase shift characteristic.

4 Claims, 4 Drawing Sheets (51) Int. Cl.
*H03F 3/21* (2006.01)
*H03F 1/32* (2006.01)
*H04L 27/38* (2006.01)
*H01P 1/18* (2006.01)

(52) U.S. Cl.
CPC ............ *H04L 27/3863* (2013.01); *H01P 1/18* (2013.01); *H03F 2200/336* (2013.01)

(58) Field of Classification Search
CPC .......... H04L 27/3863; H01P 1/18; G01S 7/03; G01S 7/282; G01S 7/285
See application file for complete search history.

(56) References Cited

U.S. PATENT DOCUMENTS

| | | | | |
|---|---|---|---|---|
| 9,876,514 | B1* | 1/2018 | Corman | H04B 1/04 |
| 2010/0067622 | A1* | 3/2010 | Komaili | H03D 3/009 |
| | | | | 375/345 |
| 2011/0075715 | A1* | 3/2011 | Kravitz | H04B 1/30 |
| | | | | 375/221 |
| 2011/0150495 | A1* | 6/2011 | Nosaka | H03H 11/20 |
| | | | | 398/135 |
| 2012/0223774 | A1* | 9/2012 | Southcombe | H03F 1/0227 |
| | | | | 330/124 R |
| 2013/0285748 | A1* | 10/2013 | Hongo | H03F 1/0222 |
| | | | | 330/291 |
| 2014/0111373 | A1* | 4/2014 | Puzella | G01S 7/032 |
| | | | | 342/174 |
| 2015/0054582 | A1* | 2/2015 | Goss | H03G 1/0017 |
| | | | | 330/279 |
| 2015/0117567 | A1* | 4/2015 | Winoto | H03F 3/195 |
| | | | | 375/297 |
| 2015/0280665 | A1* | 10/2015 | Ahmed | H03F 3/68 |
| | | | | 375/349 |

OTHER PUBLICATIONS

Kalyoncu et al. "A Phase-Calibration Method for Vector Sum Phase Shifters Using a Self-Generated LUT", IEE Transactions on Circuits and Systems I Regular Papers, vol. 66, No. 4, Apr. 2019 (Year: 2019).*

Kodama et al., "A 1.3-degree I/Q Phase Error, 7.1-8.7-GHz LO Generator with Single-Stage Digital Tuning Polyphase Filter," 2010 Symposium VLSI Circuits/Technical Digest of Papers, IEEE, 2010, pp. 145-146.

* cited by examiner

| Wc | $P_I$ | $P_Q$ | $G_I$ | $G_Q$ |
|---|---|---|---|---|
| 0 | 1 | 1 | 1 | 0 |
| ⋮ | ⋮ | ⋮ | ⋮ | ⋮ |
| $2^{N-2}$ | -1 | 1 | 0 | 1 |
| ⋮ | ⋮ | ⋮ | ⋮ | ⋮ |
| $2^{N-1}$ | 1 | -1 | 1 | 0 |
| ⋮ | ⋮ | ⋮ | ⋮ | ⋮ |
| $2^{N-1} + 2^{N-2}$ | -1 | -1 | 0 | 1 |
| ⋮ | ⋮ | ⋮ | ⋮ | ⋮ |

FIG. 5

PHASE SHIFT PRECISION CALIBRATION CIRCUITRY, VECTOR SUM PHASE SHIFTER, AND WIRELESS COMMUNICATION DEVICE

TECHNICAL FIELD

The present invention relates to phase shift precision calibration circuitry that calibrates phase shift precision of a vector sum phase shifter, a vector sum phase shifter mounting the phase shift precision calibration circuitry and a wireless communication device mounting the vector sum phase shifter.

BACKGROUND ART

For example, a radar device or the like having a phased array antenna mounted thereon needs to be equipped with a shifter that is capable of shifting a phase of a high frequency signal in order to vary a beam direction.

As the shifter capable of shifting a phase of a high frequency signal, a vector sum phase shifter is known.

The vector sum phase shifter typically includes: an orthogonal signal generator for generating from a high frequency signal an in-phase (I) signal and a quadrature (Q) signal orthogonal to each other; a first variable gain amplifier for amplifying the I signal generated by the orthogonal signal generator; a second variable gain amplifier for amplifying the Q signal generated by the orthogonal signal generator; and a signal combiner for combining the I signal amplified by the first variable gain amplifier and the Q signal amplified by the second variable gain amplifier, and for outputting a combined signal for the I signal and the Q signal.

In addition, the vector sum phase shifter includes: a table memory for storing a relation between the phase shift amount and gains of the first and second variable gain amplifiers; and a gain controller for acquiring gains associated with a phase shift amount provided from an outside by reference to the table, and for applying the acquired gains to the first and second variable gain amplifiers.

In the vector sum phase shifter with high phase shift precision, the phase difference between the I signal and the Q signal generated by the orthogonal signal generator is not shifted from 90°, and thereby the orthogonality between the I signal and the Q signal is kept. Further, the I and Q signals uniformly have the same amplitude.

The orthogonal signal generator is typically realized by an RC polyphase filter consisting of a resistor and a capacitor. However, for example, in a case where a quadrature error and an amplitude error of the I signal and the Q signal occur due to an influence of manufacturing variation of the RC polyphase filter, the phase shift precision is decreased, and thus the influence of manufacturing variation needs to be eliminated.

Non-Patent Literature 1 mentioned below discloses a calibration method of eliminating the influence of manufacturing variation by preparing a plurality of varactors usable as the capacitance of the RC polyphase filter, and selecting one of the prepared varactors to be used for the RC polyphase filter in dependence on the quadrature error and the amplitude error of the I signal and the Q signal.

CITATION LIST

Non-Patent Literature 1: H. Kodama, H. Ishikawa, N. Oshima, and A. Tanaka, "A 1.3-degree I/Q phase error, 7.1-8.7-GHz LO generator with single-stage digital tuning polyphase filter," IEEE Symp. VLSI Circuits, Dig. Tech. Pap., pp. 145-146, 2010.

SUMMARY OF INVENTION

The conventional vector sum phase shifter is configured as described above. Therefore, the phase shift precision can be improved to a certain degree by using the calibration method of selecting one of the varactors, which is to be used for the RC polyphase filter, to eliminate the influence of manufacturing variation. However, since the varactor has a parasitic series resistance component Rp that cannot be generally ignored, a transfer function of the RC polyphase filter is expressed by following Expression (1).

$$\frac{\Delta V_{Qout}}{\Delta V_{Iout}}(s) = \frac{1+sC_1(R_1+R_p)}{1-sC_1(R_1-R_p)} \quad (1)$$

In Expression (1), $C_1$ is a capacitance component of the varactor, $R_1$ is a resistance value of the resistor in the RC polyphase filter, and s is a Laplace operator. $\Delta V_{Iout}$ is a difference between a +I signal and a −I signal that are a differential I signal, and $\Delta V_{Qout}$ is a difference between a +Q signal and a −Q signal that are a differential Q signal.

It is assumed that a varactor is selected, which has the capacitance component $C_1$ capable of canceling the quadrature error between the I signal and the Q signal. In this case, the numerator and the denominator in Expression (1) do not coincide with each other, and the amplitude error arises between the I signal and the Q signal.

For the reason above, in the calibration method of selecting a varactor to be used for the RC polyphase filter from among the plurality of varactors, the amplitude error and the quadrature error of the I signal and the Q signal cannot be canceled at the same time. Therefore, there is a problem that the phase shift precision cannot be sufficiently improved.

The present invention has been made to solve the above problem. An objective of the present invention is to provide phase shift precision calibration circuitry capable of improving phase shift precision of a vector sum phase shifter.

Further objective of the present invention is to provide a vector sum phase shifter mounting the phase shift precision calibration circuitry and a wireless communication device mounting the vector sum phase shifter.

Phase shift precision calibration circuitry according to the present invention includes: a table memory to store a relation between a control code corresponding to a phase shift amount and gains of variable gain amplifiers mounted in a vector sum phase shifter; a gain controller to apply the gains associated with the control code to the variable gain amplifiers; a detector to detect amplitude and a phase from an output signal of the vector sum phase shifter; a recorder to record, when the gains are applied by the gain controller, a combination of a control code corresponding to said gains and the amplitude and the phase detected by the detector; and a calibrator to find a phase shift characteristic of the vector sum phase shifter from records of the recorder and calibrate the relation between a control code and gains recorded in the table memory by using the phase shift characteristic.

According to the present invention, the calibrator is configured to find the phase shift characteristic of the vector sum phase shifter from the records of the recorder and calibrate the relation between a control code and a gain recorded in the table memory by using the phase shift characteristic. Therefore, there is an advantage to improve the phase shift precision of the vector sum phase shifter.

DESCRIPTION OF EMBODIMENTS

Hereinafter, to describe the present invention in more detail, embodiments for implementing the present invention will be described with reference to the accompanying drawings.

Embodiment 1

Figure 1:
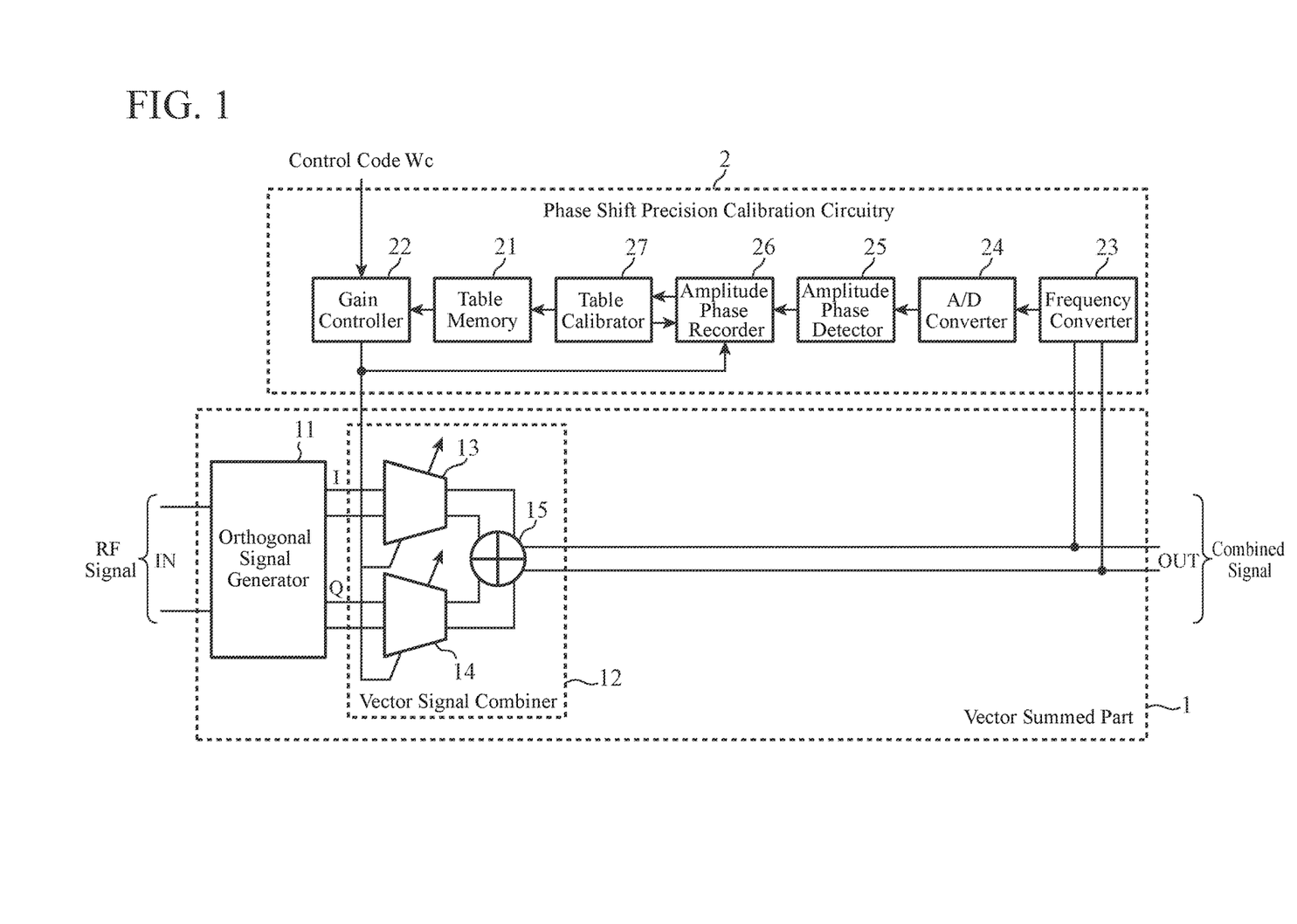
FIG. 1 is a configuration diagram illustrating a vector sum phase shifter mounting phase shift precision calibration circuitry according to Embodiment 1 of the present invention.

FIG. 1 is a configuration diagram illustrating a vector sum phase shifter mounting phase shift precision calibration circuitry according to Embodiment 1 of the present invention.

The vector sum phase shifter of FIG. 1 is mounted in a wireless communication device such as a wireless transmitter or a wireless receiver. It can be assumed, for example, that a case in which a radio frequency (RF) signal with a phase shifted by the vector sum phase shifter is transmitted by the wireless communication device or a case in which a phase of an RF signal received by the wireless communication device is shifted by the vector sum phase shifter.

In FIG. 1, a vector sum phase shifter includes a vector summed part 1 and phase shift precision calibration circuitry 2.

The vector summed part 1 includes an orthogonal signal generator 11 and a vector signal combiner 12. When a differential RF signal as an input signal is input, the vector summed part 1 generates, from the RF signal, an in-phase (I) signal and a quadrature (Q) signal orthogonal to each other. The vector summed part 1 amplifies the I signal and the Q signal, performs the vector sum on the amplified I signal and the amplified Q signal, and outputs a combined signal for the I signal and the Q signal.

The phase shift precision calibration circuitry 2 includes a table memory 21, a gain controller 22, a frequency converter 23, an analog-to-digital converter (hereinafter referred to as "A/D converter") 24, an amplitude phase detector 25, an amplitude phase recorder 26, and a table calibrator 27. The phase shift precision calibration circuitry 2 controls gains $G_I$ (Wc) and $G_Q$ (Wc) of variable gain amplifiers 13 and 14 of the vector signal combiner 12 in accordance with a control code Wc provided from an outside. In addition, the phase shift precision calibration circuitry 2 calibrates a relation between the control code Wc and the gains $G_I$ (Wc) and $G_Q$ (Wc) of the variable gain amplifiers 13 and 14. The control code Wc has an integer value equal to or more than zero.

In the Embodiment 1, it is assumed that the vector sum phase shifter has N-bit phase shift resolution, and a switching width of the phase shift is $360°/2^N$. Therefore, the phase shift amount of the vector sum phase shifter is expressed by $(360°/2^N) \times Wc$.

For example, the phase shift amount is 0° when Wc=0, the phase shift amount is 90° when $Wc=2^{N-2}$, the phase shift amount is 180° when $Wc=2^{N-1}$, and the phase shift amount is 270° when $Wc=2^{N-1}+2^{N-2}$.

The gains $G_I$ (Wc) and $G_Q$ (Wc) of the variable gain amplifiers 13 and 14 are set to values of 0 to 1 in accordance with the control code Wc.

In the Embodiment 1, an example will be described, in which the input signal to the vector sum phase shifter is the RF signal. However, the input signal is not limited to the RF signal, and a signal having a frequency other than a radio frequency may be input.

The orthogonal signal generator 11 is realized by, for example, an RC polyphase filter including a resistor and a capacitor. The orthogonal signal generator 11 generates, from the differential RF signal being the input signal, an I signal (a first signal) and a Q signal (a second signal), which are orthogonal to each other. Further, the orthogonal signal generator 11 outputs the differential I signal to the variabl gain amplifier 13 and outputs the differential Q signal to the variable gain amplifier 14.

The vector signal combiner 12 includes the variable gain amplifiers 13 and 14 and a signal combiner 15.

The variable gain amplifier 13 is a first variable gain amplifier that amplifies the differential I signal output from the orthogonal signal generator 11 with the gain $G_I$ (Wc) applied by the gain controller 22 and outputs an amplified I signal to the signal combiner 15.

The variable gain amplifier 14 is a second variable gain amplifier that amplifies the differential Q signal output from the orthogonal signal generator 11 with the gain $G_Q$ (Wc) applied by the gain controller 22 and outputs an amplified Q signal to the signal combiner 15.

The signal combiner 15 combines the differential I signal amplified by the variable gain amplifier 13 and the differential Q signal amplified by the variable gain amplifier 14 and outputs a combined signal for the I signal and the Q signal.

The table memory 21 is realized by a storage device, such as a random access memory (RAM) or a hard disk. The table memory 21 stores a table indicating a relation between the control code Wc corresponding to the phase shift amount and sign signals $P_I$ and $P_Q$ and the gains $G_I$ and $G_Q$ of the variable gain amplifiers 13 and 14. The sign signals $P_I$ and $P_Q$ indicates signs of the I signal and the Q signal output from the variable gain amplifiers 13 and 14.

The gain controller 22 may be realized by a semiconductor integrated circuit on which a central processing unit (CPU) is mounted, or by a one-chip microcomputer.

When calibrating the table stored in the table memory 21, the gain controller 22 sequentially applies a plurality of gains as the gains $G_I$ (Wc) and $G_Q$ (Wc) to the variable gain amplifiers 13 and 14.

Specifically, as the gains $G_I$ (Wc) and $G_Q$ (Wc) of the variable gain amplifiers 13 and 14, gains $G_I$ (Wc=0) and $G_Q$ (Wc=0) corresponding to the phase shift amount of 0 degrees, gains $G_I$ ($Wc=2^{N-2}$) and $G_Q$ ($Wc=2^{N-2}$) corresponding to the phase shift amount of 90 degrees, gains $G_I$ ($Wc=2^{N-1}$) and $G_Q$ ($Wc=2^{N-1}$) corresponding to the phase shift amount of 180 degrees, and gains $G_I$ ($Wc=2^{N-1}+2^{N-2}$)

and $G_Q$ (Wc=$2^{N-1}+2^{N-2}$) corresponding to the phase shift amount of 270 degrees are applied in sequence.

In actual use in outputting the combined signal for the I signal and the Q signal, the gain controller 22 acquires from the table stored in the table memory 21 the sign signals $P_I$ and $P_Q$ associated with the control code Wc and the gain $G_I$ (Wc) and $G_Q$ (Wc). The gain controller 22 applies the sign signal $P_I$ and the gain $G_I$ (Wc) to the variable gain amplifier 13, and applies the sign signal $P_Q$ and the gain $G_Q$ (Wc) to the variable gain amplifier 14.

The frequency converter 23 down-converts the output signal of the vector summed part 1, that is, the frequency of the combined signal output by the signal combiner 15 into, for example, an intermediate frequency.

The A/D converter 24 converts the combined signal, whose frequencies has been converted by the frequency converter 23, into a digital signal, and outputs the digital signal to the amplitude phase detector 25.

The amplitude phase detector 25 is a detector that detects amplitude and a phase from the digital signal output by the A/D converter 24.

The amplitude phase recorder 26 may be realized by a storage device, such as a RAM or a hard disk. The amplitude phase recorder 26 is a recorder that records, when the gains are controlled by the gain controller 22, a combination of the control code Wc corresponding to the gains and the amplitude and the phase detected by the amplitude phase detector 25.

The table calibrator 27 may be realized by a semiconductor integrated circuit on which a CPU is mounted, or by a one-chip microcomputer.

The table calibrator 27 is a calibrator that finds a phase shift characteristic argOUT of the vector summed part 1 from records of the amplitude phase recorder 26, and calibrates the relation between the control code Wc and the gains $G_I$ (Wc) and $G_Q$ (Wc) recorded in the table memory 21 by using the phase shift characteristic argOUT.

Figure 2:
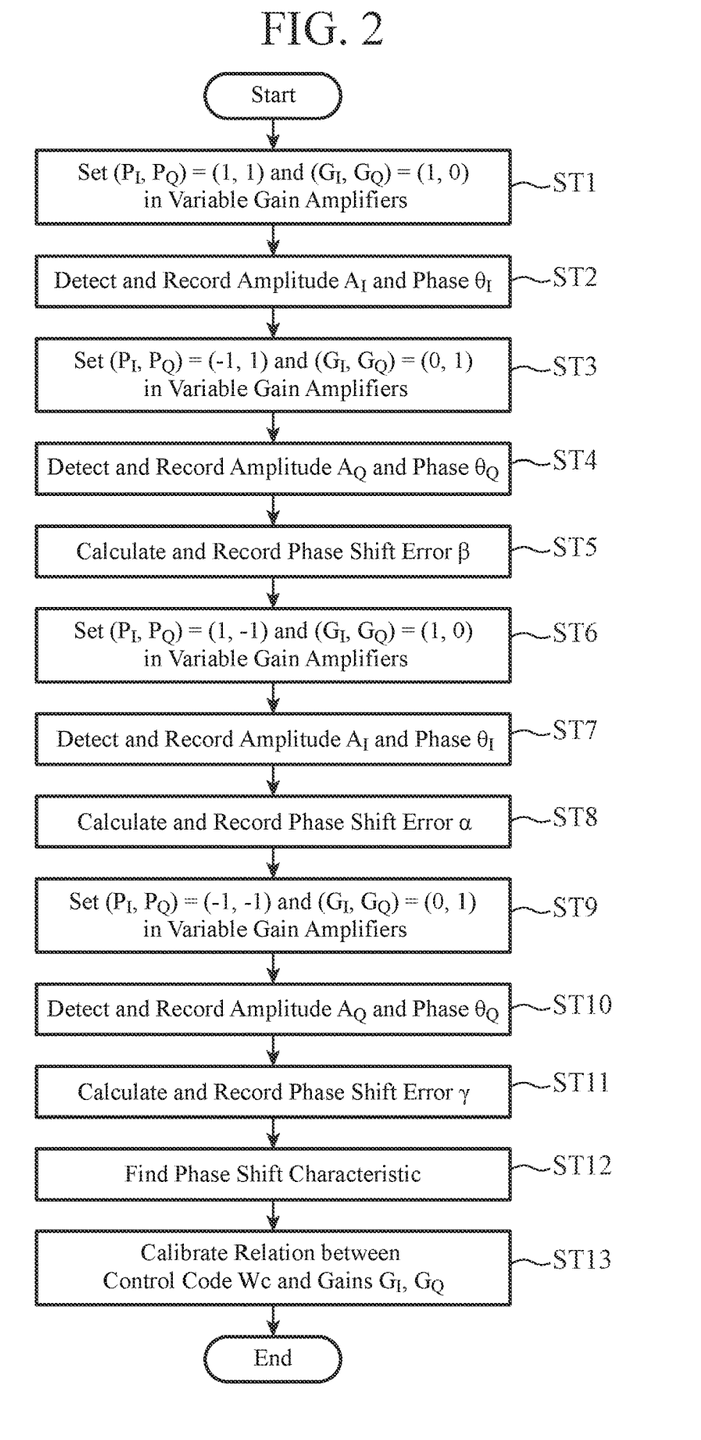
FIG. 2 is a flowchart illustrating processing content of the phase shift precision calibration circuitry according to the Embodiment 1 of the present invention.

FIG. 2 is a flowchart illustrating processing content of the phase shift precision calibration circuitry according to the Embodiment 1 of the present invention.

Figure 3:
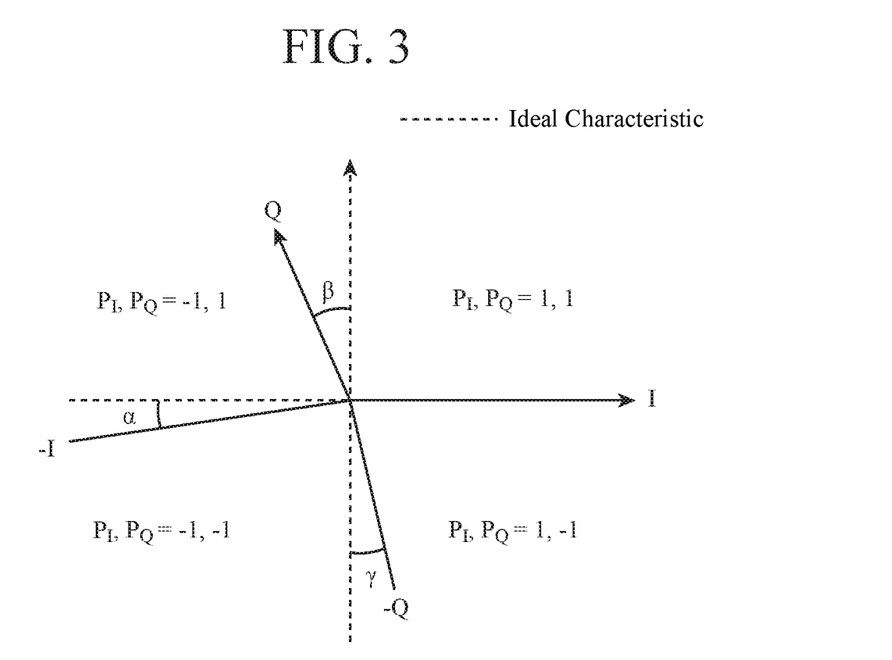
FIG. 3 is a view of an IQ plan illustrating phase shift errors of the vector sum phase shifter.

FIG. 3 is a view of an IQ plan illustrating phase shift errors of the vector sum phase shifter.

The IQ plan view of FIG. 3 illustrates a phase shift error in individual quadrants, each being distinguished by values of the sign signals $P_I$ and $P_Q$.

In FIG. 3, the I signal is depicted as a reference. In the first quadrant being $P_I$=1 and $P_Q$=1, the phase shift error between the I signal and the Q signal is β.

In the second quadrant being $P_I$=−1 and $P_Q$=1, the phase shift error between the I signal and the −I signal is α. The −I signal indicates inversion of the I signal.

In the third quadrant being $P_I$=−1 and $P_Q$=−1, the phase shift error between the I signal and the −Q signal is γ. The −Q signal indicates inversion of the Q signal.

Next, an operation will be described.

Processing details will be described, in which the phase shift precision calibration circuitry 2 calibrates the relation between the control code Wc and the gains $G_I$ (Wc) and $G_Q$ (Wc) recorded in the table of the table memory 21.

This calibration processing is assumed to be performed at the time of shipment or at the time of power on of the vector sum phase shifter. However, the time to perform the calibration processing may be arbitrary.

Figure 4:
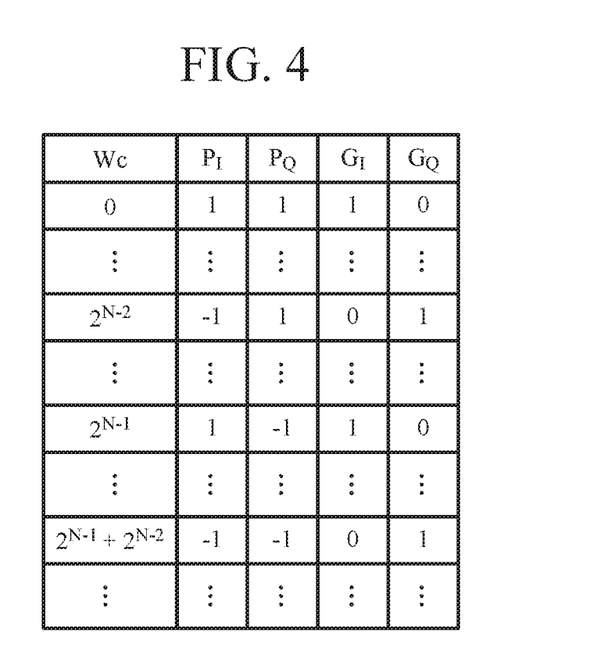
FIG. 4 is an explanatory diagram illustrating content recorded in a table of a table memory 21.

A table as illustrated in FIG. 4 is stored in the table memory 21 of the phase shift precision calibration circuitry 2.

FIG. 4 is an explanatory diagram illustrating content recorded in the table of the table memory 21.

In this table, the control code Wc corresponding to the phase shift amount, sign signals $P_I$ and $P_Q$ indicating signs of the I signal and the Q signal output from the variable gain amplifiers 13 and 14, and the gains $G_I$ and $G_Q$ of the variable gain amplifiers 13 and 14 are recorded.

The gain controller 22 of the phase shift precision calibration circuitry 2 refers to the table in the table memory 21 for acquiring the sign signals $P_I$ and $P_Q$ and the gains $G_I$ and $G_Q$ that are associated with the control code Wc corresponding to the phase shift amount of 0°.

Specifically, since the control code Wc=0 corresponds to the phase shift amount of 0°, the gain controller 22 acquires $(P_I, P_Q)$=(1, 1) and $(G_1 (0), G_Q (0))$=(1, 0) that are associated with Wc=0.

Upon acquiring the sign signals $(P_I, P_Q)$=(1, 1) and the gains $(G_1 (0), G_Q (0))$=(1, 0), the gain controller 22 applies the sign signal $P_I$=1 and the gain $G_I$ (0)=1 to the variable gain amplifier 13 and also applies the sign signal $P_Q$=1 and the gain $G_Q$ (0)=0 to the variable gain amplifier 14 (step ST1 in FIG. 2). The gain controller 22 outputs the control code Wc=0 to the amplitude phase recorder 26.

Note that the gain G=1 indicates the maximum gain of the variable gain amplifier. The gain G=0 indicates that the gain of the variable gain amplifier is zero and there is no signal output.

The orthogonal signal generator 11 of the vector summed part 1 generates, from the differential RF signal being the input signal, the I signal and the Q signal that are orthogonal to each other. The orthogonal signal generator 11 outputs the differential I signal to the variable gain amplifier 13 and outputs the differential Q signal to the variable gain amplifier 14.

The sign signal and the gain $G_I$ (Wc) having been applied by the gain controller 22 are $P_I$=1 and $G_I$ (0)=1, respectively. Therefore, upon receiving the differential I signal from the orthogonal signal generator 11, the variable gain amplifier 13 amplifies the I signal by the maximum gain without inverting the sign of the I signal, and outputs an amplified I signal to the signal combiner 15.

On the other hand, the gain $G_Q$ (Wc) having been applied by the gain controller 22 is $G_Q$ (0)=0. Therefore, the variable gain amplifier 14 does not output a Q signal to the signal combiner 15 even if receiving the differential Q signal from the orthogonal signal generator 11.

The differential Q signal is not output from the variable gain amplifier 14. Therefore, upon receiving the amplified differential I signal from the variable gain amplifier 13, the signal combiner 15 outputs the differential I signal as a combined signal.

Upon receiving the combined signal from the signal combiner 15, the frequency converter 23 of the phase shift precision calibration circuitry 2 performs the downconversion on the frequency of the combined signal into an intermediate frequency, or the like.

The A/D converter 24 converts the combined signal with the frequency converted by the frequency converter 23 into a digital signal, and outputs the digital signal to the amplitude phase detector 25.

Upon receiving the digital signal from the A/D converter 24, the amplitude phase detector 25 detects the amplitude $A_I$ and the phase $θ_I$ from the digital signal.

After the amplitude phase detector 25 detects the amplitude $A_I$ and the phase $θ_I$ from the digital signal, the amplitude phase recorder 26 records a combination of the control code Wc=0 output from the gain controller 22 and the amplitude $A_I$ and the phase $\theta_I$ (step ST2).

Hereinafter, the amplitude $A_I$ and the phase $\theta_I$ associated with the control code Wc=0 may be denoted as "amplitude $A_I(0)$" and "phase $\theta_I(0)$".

Subsequently, the gain controller 22 of the phase shift precision calibration circuitry 2 refers to the table of the table memory 21 for acquiring the sign signals $P_I$ and $P_Q$ and the gains $G_I$ and $G_Q$, which are associated with the control code Wc corresponding to the phase shift amount of 90°.

Specifically, the control code Wc corresponding to the phase shift amount of 90° is $2^{N-2}$. Therefore, the gain controller 22 acquires $(P_I, P_Q)=(-1, 1)$ and $(G_I(2^{N-2}), GQ(2^{N-2}))=(0, 1)$ associated with Wc=$2^{N-2}$.

Upon acquiring the sign signal $(P_I, P_Q)=(-1, 1)$ and the gains $(G_I(2^{N-2}), G_Q(2^{N-2}))=(0, 1)$, the gain controller 22 applies the sign signal $P_I=-1$ and the gain $G_I(2^{N-2})=0$ to the variable gain amplifier 13 and applies the sign signal $P_Q=1$ and the gain $G_Q(2^{N-2})=1$ to the variable gain amplifier 14 (step ST3 in FIG. 2). Further, the gain controller 22 outputs the control code Wc=$2^{N-2}$ to the amplitude phase recorder 26.

The orthogonal signal generator 11 of the vector summed part 1 generates, from the differential RF signal being the input signal, the I signal and the Q signal that are orthogonal to each other. The orthogonal signal generator 11 outputs the differential I signal to the variable gain amplifier 13 and outputs the differential Q signal to the variable gain amplifier 14.

The gain $G_I(Wc)$ having been applied by the gain controller 22 is $G_I(2^{N-2})=0$. Therefore, the variable gain amplifier 13 does not output an I signal to the signal combiner 15 even if receiving the differential I signal from the orthogonal signal generator 11.

The sign signal and the gain $G_Q(Wc)$ having been applied by the gain controller 22 are $P_Q=1$ and $G_Q(2^{N-2})=1$, respectively. Therefore, upon receiving the differential Q signal from the orthogonal signal generator 11, the variable gain amplifier 14 amplifies the Q signal by the maximum gain without inverting the sign of the Q signal and outputs an amplified Q signal to the signal combiner 15.

Upon receiving the amplified differential Q signal from the variable gain amplifier 14, the signal combiner 15 outputs the differential Q signal as a combined signal because the differential I signal are not output from the variable gain amplifier 13.

Upon receiving the combined signal from the signal combiner 15, the frequency converter 23 of the phase shift precision calibration circuitry 2 performs the downconversion on the frequency of the combined signal into an intermediate frequency, or the like.

The A/D converter 24 converts the combined signal with the frequency converted by the frequency converter 23 into a digital signal, and outputs the digital signal to the amplitude phase detector 25.

Upon receiving the digital signal from the A/D converter 24, the amplitude phase detector 25 detects the amplitude $A_Q$ and the phase $\theta_Q$ from the digital signal.

After the amplitude phase detector 25 detects the amplitude $A_Q$ and the phase $\theta_Q$ from the digital signal, the amplitude phase recorder 26 records a combination of the control code Wc=$2^{N-2}$ output from the gain controller 22 and the amplitude $A_Q$ and the phase $\theta_Q$ (step ST4).

Hereinafter, the amplitude $A_Q$ and the phase $\theta_Q$ associated with the control code Wc=$2^{N-2}$ may be denoted as "amplitude $A_Q(2^{N-2})$" and "phase $\theta_Q(2^{N-2})$".

The table calibrator 27 calculates, through the following Expression (2), an amplitude ratio $A_{Q/I1}$ of the amplitude $A_Q(2^{N-2})$ to the amplitude $A_I(0)$ by using the amplitude $A_I(0)$ obtained with the phase shift amount of 0° and the amplitude $A_Q(2^{N-2})$ obtained with the phase shift amount of 90°, each of which has been recorded in the amplitude phase recorder 26. After that, the table calibrator 27 records the amplitude ratio $A_{Q/I1}$ to the amplitude phase recorder 26.

$$A_{Q/I1} = \frac{A_Q(2^{N-2})}{A_I(0)} \tag{2}$$

Further, the table calibrator 27 calculates, through the following Expression (3), a phase difference $\Delta\theta_1$ between the phase $\theta_I(0)$ and the phase $\theta_Q(2^{N-2})$ by using the phase $\theta_I(0)$ obtained with the phase shift amount of 0° and the phase $\theta_Q(2^{N-2})$ obtained with the the phase shift amount of 90°, each of which has been recorded in the amplitude phase recorder 26.

$$\Delta\theta_1 = |\theta_I(0) - \theta_Q(2^{N-2})| \tag{3}$$

Upon calculating the phase difference $\Delta\theta_1$, the table calibrator 27 calculates though the following Expression (4) an error for an ideal value 90° of the phase difference $\Delta\theta_1$, that is, the phase shift error $\beta$ illustrated in FIG. 3, and records the phase shift error $\beta$ to the amplitude phase recorder 26 (step ST5 in FIG. 2).

$$\beta = \Delta\theta_1 - 90 \tag{4}$$

Subsequently, the gain controller 22 of the phase shift precision calibration circuitry 2 refers to the table of the table memory 21 for acquiring the sign signals $P_I$ and $P_Q$ and the gains $G_I$ and $G_Q$, which are associated with the control code Wc corresponding to the phase shift amount of 180°.

Specifically, the control code Wc corresponding to the phase shift amount of 180° is $2^{N-1}$. Therefore, the gain controller 22 acquires $(P_I, P_Q)=(1, -1)$ and $(G_1(2^{N-1}), G_Q(2^{N-1}))=(1, 0)$ associated with Wc=$2^{N-1}$.

Upon acquiring the sign signal $(P_I, P_Q)=(1, -1)$ and the gains $(G_1(2^{N-1}), G_Q(2^{N-1}))=(1, 0)$, the gain controller 22 applies the sign signal $P_I=1$ and the gain $G_I(2^{N-1})=1$ to the variable gain amplifier 13 and applies the sign signal $P_Q=-1$ and the gain $G_Q(2^{N-1})=0$ to the variable gain amplifier 14 (step ST6 in FIG. 2). Further, the gain controller 22 outputs the control code Wc=$2^{N-1}$ to the amplitude phase recorder 26.

The orthogonal signal generator 11 of the vector summed part 1 generates, from the differential RF signal being the input signal, the I signal and the Q signal that are orthogonal to each other. The orthogonal signal generator 11 outputs the differential I signal to the variable gain amplifier 13 and outputs the differential Q signal to the variable gain amplifier 14.

The sign signal and the gain $G_I(Wc)$ having been applied by the gain controller 22 are $P_I=1$ and $G_I(2^{N-1})$, respectively. Therefore, upon receiving the differential I signal from the orthogonal signal generator 11, the variable gain amplifier 13 amplifies the received I signal by the maximum gain without inverting the sign of this I signal, and outputs an amplified I signal to the signal combiner 15.

On the other hand, the gain $G_Q(Wc)$ having been applied by the gain controller 22 is $G_Q(2^{N-1})=0$. Therefore, the variable gain amplifier 14 does not output a Q signal to the signal combiner 15 even if receiving the differential Q signal from the orthogonal signal generator 11.

The differential Q signal is not output from the variable gain amplifier 14. Therefore, upon receiving the amplified differential I signal from the variable gain amplifier 13, the signal combiner 15 outputs the differential I signal as a combined signal.

Upon receiving the combined signal from the signal combiner 15, the frequency converter 23 of the phase shift precision calibration circuitry 2 performs the downconversion on the frequency of the combined signal into an intermediate frequency, or the like.

The A/D converter 24 converts the combined signal with the frequency converted by the frequency converter 23 into a digital signal, and outputs the digital signal to the amplitude phase detector 25.

Upon receiving the digital signal from the A/D converter 24, the amplitude phase detector 25 detects the amplitude $A_I$ and the phase $\theta_I$ from the digital signal.

After the amplitude phase detector 25 detects the amplitude $A_I$ and the phase $\theta_I$ from the digital signal, the amplitude phase recorder 26 records a combination of the control code Wc=$2^{N-1}$ output from the gain controller 22 and the amplitude $A_I$ and the phase $\theta_I$ (step ST7).

Hereinafter, the amplitude $A_I$ and the phase $\theta_1$ associated with the control code Wc=$2^{N-1}$ may be denoted as "amplitude $A_I$ ($2^{N-1}$)" and "phase $\theta_1(2^{N-1})$".

The table calibrator 27 calculates, through the following Expression (5), a phase difference $\Delta\theta_2$ between the phase $\theta_I$ (0) and the phase $\theta_1(2^{N-1})$ by using the phase $\theta_I(0)$ obtained with the phase shift amount of 0° and the phase $\theta_1$ ($2^{N-1}$) obtained with the phase shift amount of 180°, each of which has been recorded in the amplitude phase recorder 26.

$$\Delta\theta_2 = |\theta_1(0) - \theta_1(2^{N-1})| \quad (5)$$

Upon calculating the phase difference $\Delta\theta_2$, the table calibrator 27 calculates though the following Expression (6) an error for an ideal value 180° of the phase difference $\Delta\theta_2$, that is, the phase shift error $\alpha$ illustrated in FIG. 3, and records the phase shift error a to the amplitude phase recorder 26 (step ST8 in FIG. 2).

$$\alpha = \Delta\theta_2 - 180 \quad (6)$$

Subsequently, the gain controller 22 of the phase shift precision calibration circuitry 2 refers to the table of the table memory 21 for acquiring the sign signals $P_I$ and $P_Q$ and the gains $G_I$ and $G_Q$, which are associated with the control code Wc corresponding to the phase shift amount of 270°.

Specifically, the control code Wc corresponding to the phase shift amount of 270° is $2^{N-1}+2^{N-2}$. Therefore, the gain controller 22 acquires $(P_I, P_Q)=(-1, -1)$ and $(G_1 (2^{N-1}+2^{N-2}), G_Q (2^{N-1}+2^{N-2}))=(0, 1)$ associated with Wc=$2^{N-1}+2^{N-2}$.

Upon acquiring the sign signal $(P_I, P_Q)=(-1, -1)$ and the gains $(G_1 (2^{N-1}+2^{N-2}), G_Q (2^{N-1}+2^{N-2}))=(0, 1)$, the gain controller 22 applies the sign signal $P_I=-1$ and the gain $G_I (2^{N-1}+2^{N-2})=0$ to the variable gain amplifier 13 and applies the sign signal $P_Q=-1$ and the gain $G_Q (2^{N-1}+2^{N-2})=1$ to the variable gain amplifier 14 (step ST9 in FIG. 2). Further, the gain controller 22 outputs the control code Wc=$2^{N-1}+2^{N-2}$ to the amplitude phase recorder 26.

The orthogonal signal generator 11 of the vector summed part 1 generates, from the differential RF signal being the input signal, the I signal and the Q signal that are orthogonal to each other. The orthogonal signal generator 11 outputs the differential I signal to the variable gain amplifier 13 and outputs the differential Q signal to the variable gain amplifier 14.

The gain $G_I$ (Wc) having been applied by the gain controller 22 is $(G_I (2^{N-1}+2^{N-2})=0$. Therefore, the variable gain amplifier 13 does not output an I signal to the signal combiner 15 even if receiving the differential I signal from the orthogonal signal generator 11.

The sign signal and the gain $G_Q$ (Wc) having been applied by the gain controller 22 are $P_Q=-1$ and $G_Q (2^{N-1}+2^{N-2})=1$, respectively. Therefore, upon receiving the differential Q signal from the orthogonal signal generator 11, the variable gain amplifier 14 amplifies the Q signal by the maximum gain and inverts the signs of the amplified Q signal. After that, the variable gain amplifier 14 outputs an amplified Q signal, whose signs have been inverted, to the signal combiner 15.

Upon receiving the amplified differential Q signal from the variable gain amplifier 14, the signal combiner 15 outputs the differential Q signal as a combined signal because the differential I signal are not output from the variable gain amplifier 13.

Upon receiving the combined signal from the signal combiner 15, the frequency converter 23 of the phase shift precision calibration circuitry 2 performs the downconversion on the frequency of the combined signal into an intermediate frequency, or the like.

The A/D converter 24 converts the combined signal with the frequency converted by the frequency converter 23 into a digital signal, and outputs the digital signal to the amplitude phase detector 25.

Upon receiving the digital signal from the A/D converter 24, the amplitude phase detector 25 detects the amplitude $A_Q$ and the phase $\theta_Q$ from the digital signal.

After the amplitude phase detector 25 detects the amplitude $A_Q$ and the phase $\theta_Q$ from the digital signal, the amplitude phase recorder 26 records a combination of the control code Wc=$2^{N-1}+2^{N-2}$ output from the gain controller 22 and the amplitude $A_Q$ and the phase $\theta_Q$ (step ST10).

Hereinafter, the amplitude $A_Q$ and the phase $\theta_Q$ associated with the control code Wc=$2^{N-1}+2^{N-2}$ may be denoted as "amplitude $A_Q$ ($2^{N-1}+2^{N-2}$)" and "phase $\theta_Q$ ($2^{N-1}+2^{N-2}$)".

The table calibrator 27 calculates, through the following Expression (7), an amplitude ratio $A_{Q/I2}$ of the amplitude $A_Q$ ($2^{N-1}+2^{N-2}$) to the amplitude $A_I$ ($2^{N-1}$) by using the amplitude $A_I$ ($2^{N-1}$) obtained with the phase shift amount of 180° and the amplitude $A_Q$ ($2^{N-1}+2^{N-2}$) obtained with the phase shift amount of 270°, each of which has been recorded in the amplitude phase recorder 26. After that, the table calibrator 27 records the amplitude ratio $A_{Q/I2}$ to the amplitude phase recorder 26.

$$A_{Q/I2} = \frac{A_Q(2^{N-1}+2^{N-2})}{A_I(2^{N-1})} \quad (7)$$

Further, the table calibrator 27 calculates, through the following Expression (8), a phase difference $\Delta\theta_3$ between the phase $\theta_1(0)$ and the phase $\theta_Q$ ($2^{N-1}+2^{N-2}$) by using the phase $\theta_1$ (0) obtained with the phase shift amount of 0° and the phase $\theta_Q$ ($2^{N-1}+2^{N-2}$) obtained with the the phase shift amount of 270°, each of which has been recorded in the amplitude phase recorder 26.

$$\Delta\theta_3 = |\theta_1(0) - \theta_Q(2^{N-1}+2^{N-2})| \quad (8)$$

Upon calculating the phase difference $\Delta\theta_3$, the table calibrator 27 calculates though the following Expression (9) an error for an ideal value 270° of the phase difference $\Delta\theta_3$, that is, the phase shift error $\gamma$ illustrated in FIG. 3, and records the phase shift error $\gamma$ to the amplitude phase recorder 26 (step ST11 in FIG. 2).

$$\gamma = \Delta\theta_3 - 270 \quad (9)$$

Next, the table calibrator 27 finds, though in the following Expressions (10) to (13), the phase shift characteristic argOUT of the vector summed part 1 by using the sign signals ($P_I$, $P_Q$) and the gains ($G_I$, $G_Q$) obtained with the phase shift amount of 0°, the sign signals ($P_I$, $P_Q$) and the gains ($G_I$, $G_Q$) obtained with the phase shift amount of 90°, the sign signals ($P_I$, $P_Q$) and the gains ($G_I$, $G_Q$) obtained with the phase shift amount of 180°, the sign signals ($P_I$, $P_Q$) and the gains ($G_I$, $G_Q$) obtained with the phase shift amount of 270°, the phase shift errors α, β, and γ, and the amplitude ratios $A_{Q/I1}$ and $A_{Q/I2}$, each of which has been recorded in the amplitude phase recorder 26 (step ST12 in FIG. 2).

[1] For $Wc = 0$ to $2^{N-2} - 1$ (10)

$$argOUT = \tan^{-1} \frac{P_Q(Wc)G_Q(Wc)A_Q(Wc)\cos\beta}{P_I(Wc)G_I(Wc)A_I(Wc) - P_Q(Wc)G_Q(Wc)A_Q(Wc)\sin\beta}$$

$$= \tan^{-1} \frac{P_Q(Wc)G_Q(Wc)A_{Q/I1}\cos\beta}{P_I(Wc)G_I(Wc) - P_Q(Wc)G_Q(Wc)A_{Q/I1}\sin\beta}$$

[2] For $Wc = 2^{N-2}$ to $2^{N-1} - 1$ (11)

$$argOUT = \tan^{-1} \frac{P_I(Wc)G_I(Wc)A_I(Wc)\sin\alpha + P_Q(Wc)G_Q(Wc)A_Q(Wc)\cos\beta}{P_I(Wc)G_I(Wc)A_I(Wc)\cos\alpha - P_Q(Wc)G_Q(Wc)A_Q(Wc)\sin\beta}$$

$$= \tan^{-1} \frac{P_I(Wc)G_I(Wc)\sin\alpha + P_Q(Wc)G_Q(Wc)A_{Q/I1}\cos\beta}{P_I(Wc)G_I(Wc)\cos\alpha - P_Q(Wc)G_Q(Wc)A_{Q/I1}\sin\beta}$$

[3] For $Wc = 2^{N-1}$ to $2^{N-1} + 2^{N-2} - 1$ (12)

$$argOUT = \tan^{-1} \frac{P_I(Wc)G_I(Wc)A_I(Wc)\sin\alpha + P_Q(Wc)G_Q(Wc)A_Q(Wc)\cos\gamma}{P_I(Wc)G_I(Wc)A_I(Wc)\cos\alpha - P_Q(Wc)G_Q(Wc)A_Q(Wc)\sin\gamma}$$

$$= \tan^{-1} \frac{P_I(Wc)G_I(Wc)\sin\alpha + P_Q(Wc)G_Q(Wc)A_{Q/I2}\cos\gamma}{P_I(Wc)G_I(Wc)\cos\alpha - P_Q(Wc)G_Q(Wc)A_{Q/I2}\sin\gamma}$$

[4] For $Wc = 2^{N-1} + 2^{N-2}$ to $2^N - 1$ (13)

$$argOUT = \tan^{-1} \frac{P_Q(Wc)G_Q(Wc)A_Q(Wc)\cos\gamma}{P_I(Wc)G_I(Wc)A_I(Wc) - P_Q(Wc)G_Q(Wc)A_Q(Wc)\sin\gamma}$$

$$= \tan^{-1} \frac{P_Q(Wc)G_Q(Wc)A_{Q/I2}\cos\gamma}{P_I(Wc)G_I(Wc) - P_Q(Wc)G_Q(Wc)A_{Q/I2}\sin\gamma}$$

Upon finding the phase shift characteristic argOUT of the vector summed part 1, the table calibrator 27 defines an evaluation function E (Wc) as described in the following Expressions (14) to (17) by using the phase shift characteristic argOUT.

[1] For $Wc = 0$ to $2^{N-2} - 1$ (14)

$$E(Wc) = \tan^{-1} \frac{P_Q(Wc)G_Q(Wc)A_{Q/I1}\cos\beta}{P_I(Wc)G_I(Wc) - P_Q(Wc)G_Q(Wc)A_{Q/I1}\sin\beta} - \frac{360}{2^N}Wc$$

[2] For $Wc = 2^{N-2}$ to $2^{N-1} - 1$ (15)

$$E(Wc) = \tan^{-1} \frac{P_I(Wc)G_I(Wc)\sin\alpha + P_Q(Wc)G_Q(Wc)A_{Q/I1}\cos\beta}{P_I(Wc)G_I(Wc)\cos\alpha - P_Q(Wc)G_Q(Wc)A_{Q/I1}\sin\beta} - \frac{360}{2^N}Wc$$

[3] For $Wc = 2^{N-1}$ to $2^{N-1} + 2^{N-2} - 1$ (16)

$$E(Wc) = \tan^{-1} \frac{P_I(Wc)G_I(Wc)\sin\alpha + P_Q(Wc)G_Q(Wc)A_{Q/I2}\cos\gamma}{P_I(Wc)G_I(Wc)\cos\alpha - P_Q(Wc)G_Q(Wc)A_{Q/I2}\sin\gamma} - \frac{360}{2^N}Wc$$

[4] For $Wc = 2^{N-1} + 2^{N-2}$ to $2^N - 1$ (17)

$$E(Wc) = \tan^{-1} \frac{P_Q(Wc)G_Q(Wc)A_{Q/I2}\cos\gamma}{P_I(Wc)G_I(Wc) - P_Q(Wc)G_Q(Wc)A_{Q/I2}\sin\gamma} - \frac{360}{2^N}Wc$$

After defining the evaluation function E (Wc), the table calibrator 27 obtains gains $G_I$ (Wc) and $G_Q$ (Wc) of the variable gain amplifiers 13 and 14, whose evaluation function E (Wc) indicates a minimum. Those gains $G_I$ (Wc) and $G_Q$ (Wc) are obtained for each control code Wc shifted by the width of $360°/2^N$ within 0° to 360°.

The processing of obtaining the gains $G_I$ (Wc) and $G_Q$ (Wc) whose evaluation function E (Wc) indicates a minimum is equivalent to processing of solving a so-called optimization problem. Although any method may be used for solving the optimization problem, a "genetic algorithm" or the like can be used, for example.

After obtaining the gains $G_I$ (Wc) and $G_Q$ (Wc) of the variable gain amplifiers 13 and 14, each of whose evaluation function E (Wc) indicates a minimum, for each control code Wc, the table calibrator 27 calibrates the relation between the control code Wc and the gains $G_I$ (Wc) and $G_Q$ (Wc) by rewriting the gains $G_I$ (Wc) and $G_Q$ (Wc) associated with the control code Wc recorded in the table in the table memory 21 with the obtained gains $G_I$ (Wc) and $G_Q$ (Wc) (step ST13 in FIG. 2).

Figure 5:
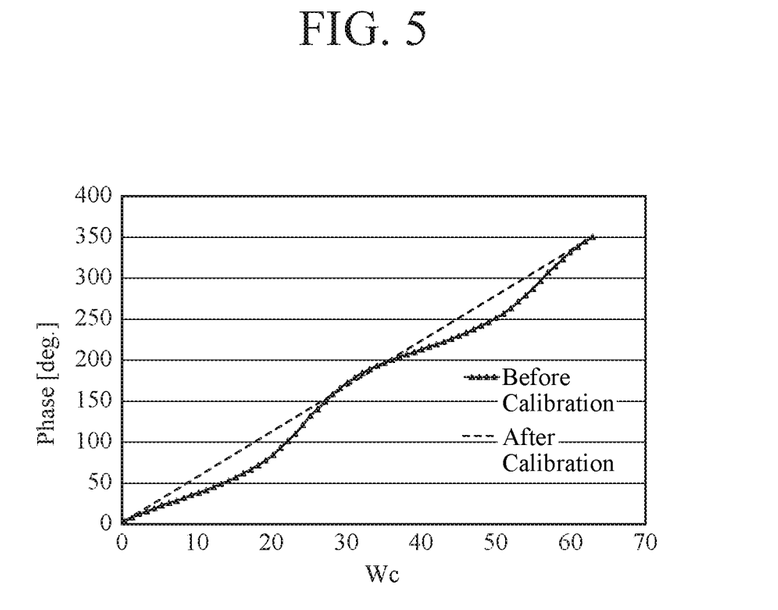
FIG. 5 is an explanatory diagram illustrating a characteristic of a phase shift amount before and after calibration of gains at a table calibrator 27.

FIG. 5 is an explanatory diagram illustrating a characteristic of a phase shift amount before and after calibration of gains at a table calibrator 27.

The characteristic of the phase shift amount before the calibration of gains includes a phase shift error and thus waves. In contrast, the characteristic of the phase shift amount after the calibration is linear because the phase shift error is eliminated.

Next, processing contents of the phase shifter will be described, in which the I signal and the Q signal are generated from the RF signal and the combined signal of the I signal and the Q signal are output.

Upon receiving from the outside the control code Wc corresponding to a desired phase shift amount, the gain controller 22 refers to the table stored in the table memory 21 for acquiring the sign signals $P_I$ and $P_Q$ and the gains $G_I$ and $G_Q$ associated with the control code Wc.

For instance, when the desired phase shift amount is 90°, the sign signals ($P_I$, $P_Q$)=(−1, 1) and the gains ($G_I(2^{N-2})$, $G_Q(2^{N-2})$) associated with Wc=$2^{N-2}$ are acquired. The acquired gains ($G_I(2^{N-2})$, $G_Q(2^{N-2})$) have been rewritten.

After acquiring the sign signals $P_I$ and $P_Q$ and the gains $G_I$ and $G_Q$ associated with the control code Wc, the gain controller 22 applies the sign signal $P_I$ and the gain $G_I$ to the variable gain amplifier 13, and also applies the sign signal $P_Q$ and the gain $G_Q$ to the variable gain amplifier 14.

The orthogonal signal generator 11 of the vector summed part 1 generates, from the differential RF signal being the input signal, the I signal and the Q signal that are orthogonal to each other. The orthogonal signal generator 11 outputs the differential I signal to the variable gain amplifier 13 and outputs the differential Q signal to the variable gain amplifier 14.

Upon receiving the differential I signal from the orthogonal signal generator 11, the variable gain amplifier 13 amplifies and inverts the I signal depending on an amount of the gain $G_I$ and a polarity of the sign signal $P_I$ applied by the gain controller 22, and outputs the inverted amplified I signal to the signal combiner 15.

Upon receiving the differential Q signal from the orthogonal signal generator 11, the variable gain amplifier 14 amplifies and inverts the Q signal depending on an amount of the gain $G_Q$ and a polarity of the sign signal $P_Q$ applied by the gain controller 22, and outputs the inverted amplified Q signal to the signal combiner 15.

Upon receiving the differential I signal from the variable gain amplifier 13 and receiving the differential Q signal from the variable gain amplifier 14, the signal combiner 15 combines the I signal and the Q signal, and outputs a combined signal for the I signal and the Q signal.

As is clear from the above description, according to the Embodiment 1, the table calibrator 27 is configured to find the phase shift characteristic argOUT of the vector summed part 1 from records of the amplitude phase recorder 26, and calibrate the relation between the control code Wc recorded in the table memory 21 and the gains $G_I(Wc)$ and $G_Q(Wc)$ by using the phase shift characteristic argOUT. Therefore, an effect is exhibited to improve the phase shift precision of the vector summed part 1.

That is, according to the Embodiment 1, the relation between the control code Wc and the gains $G_I(Wc)$ and $G_Q(Wc)$ can be calibrated without adding a new circuit onto a signal line in the vector summed part 1. Therefore, the phase shift error caused by the manufacturing variation or the like can be eliminated without being affected by characteristic deterioration accompanying the addition of a new circuit. As a result, the yield of the vector sum phase shifter can be increased.

In the Embodiment 1, when the phase shift precision calibration circuitry 2 calibrates the relation between the control code Wc and the gains $G_I(Wc)$ and $G_Q(Wc)$ recorded in the table of the table memory 21, the gain controller 22 acquires the sign signals $P_I$ and $P_Q$ and the gains $G_I$ and $G_Q$ that are associated with the control codes Wc corresponding to the phase shift amounts of 0°, 90°, 180°, and 270° and applies the sign signals $P_I$ and the gain $G_I$ to the variable gain amplifier 13 and also applies the sign signal $P_Q$ and the gain $G_Q$ to the variable gain amplifier 14.

However, the sign signals $P_I$ and $P_Q$ and the gains $G_I$ and $G_Q$ acquired by the phase shift precision calibration circuitry 2 are not limited to the sign signals $P_I$ and $P_Q$ and the gains $G_I$ and $G_Q$ that are associated with the control codes Wc corresponding to the phase shift amounts of 0°, 90°, 180°, and 270°.

Specifically, the sign signals $P_I$ and $P_Q$ and the gains $G_I$ and $G_Q$ that are associated with the control codes Wc corresponding to a phase shift amount satisfying 0°≤ the phase shift amount <90°, a phase shift amount satisfying 90°≤ the phase shift amount <180°, a phase shift amount satisfying 180°≤ the phase shift amount <270°, and a phase shift amount satisfying 270°≤ the phase shift amount <360° may be respectively acquired. By acquiring those amounts, the phase shift characteristic argOUT of the vector summed part 1 can be found, and the relation between the control code Wc recorded in the table of the table memory 21 and the gains $G_I(Wc)$ and $G_Q(Wc)$ can be calibrated, similarly to the above-described Embodiment 1.

Embodiment 2

In the Embodiment 1, the table calibrator 27 calculates the amplitude ratio $A_{Q/I1}$ of the amplitude $A_Q(2^{N-2})$ to the amplitude $A_I(0)$ by using the amplitude $A_I(0)$ obtained with the phase shift amount of 0° and the amplitude $A_Q(2^{N-2})$ obtained with the phase shift amount of 90°, and also calculates the amplitude ratio $A_{Q/I2}$ of the amplitude $A_Q$ $(2^{N-1}+2^{N-2})$ to the amplitude $A_I(2^{N-1})$ by using the amplitude $A_I(2^{N-1})$ obtained with the phase shift amount of 180° and the amplitude $A_Q(2^{N-1}+2^{N-2})$ obtained with the phase shift amount of 270°.

However, the amplitude ratio $A_{Q/I1}$ is limited to be calculated from the amplitude $A_I(0)$ at the phase shift amount 0° and the amplitude $A_Q(2^{N-2})$ at the phase shift amount 90°. For example, the amplitude ratio $A_{Q/I1}$ may be calculated from the amplitude $A_I(0)$ at the phase shift amount 0° and the amplitude $A_Q$ obtained with the phase shift amount satisfying "0°≤ the phase shift amount <180°".

Similarly, the amplitude ratio $A_{Q/I2}$ is not limited to be calculated from the amplitude $A_I(2^{N-1})$ at the phase shift amount 180° and the amplitude $A_Q(2^{N-1}+2^{N-2})$ at the phase shift amount 270°. For example, the amplitude ratio $A_{Q/I2}$ may be calculated from the amplitude $A_I(2^{N-1})$ at the phase shift amount 180° and the amplitude $A_Q$ obtained with the phase shift amount satisfying "180°≤ the phase shift amount <360°".

In the Embodiment 2, an example will be described, in which an amplitude ratio $A_{Q/I1}$ of the amplitude $A_Q(2^{N-3})$ to the amplitude $A_I(0)$ is calculated from the amplitude $A_I(0)$ at the phase shift amount 0° and the amplitude $A_Q(2^{N-3})$ at the phase shift amount 45°, and an amplitude ratio $A_{Q/I2}$ of the amplitude $A_Q(2^{N-1}+2^{N-3})$ to the amplitude $A_I(2^{N-1})$ is calculated from the amplitude $A_I(2^{N-1})$ at the phase shift amount 180° and the amplitude $A_Q(2^{N-1}+2^{N-3})$ at the phase shift amount 225°.

Specifically, it is as follows.

The gain controller 22 of the phase shift precision calibration circuitry 2 refers to the table of the table memory 21 for acquiring sign signals $P_I$ and $P_Q$ and gains $G_I$ and $G_Q$ that are associated with a control code Wc corresponding to the phase shift amount of 45°.

That is, since the control code Wc corresponding to the phase shift amount of 45° is $2^{N-3}$, the gain controller 22 acquires $(P_I, P_Q)=(1, 1)$ and $(G_I(2^{N-3}), G_Q(2^{N-3}))=(1/\sqrt{2}, 1/\sqrt{2})$ associated with $Wc=2^{N-3}$.

After acquiring the sign signals $(P_I, P_Q)=(1, 1)$ and the gains $((G_I(2^{N-3}), G_Q(2^{N-3}))=(1/\sqrt{2}, 1/\sqrt{2})$, the gain controller 22 applies the sign signal $P_I=1$ and the gain $G_I(2^{N-3})=1/\sqrt{2}$ to the variable gain amplifier 13 and applies the sign signal $P_Q=1$ and the gain $G_Q(2^{N-3})=1/\sqrt{2}$ to the variable gain amplifier 14. The gain controller 22 outputs the control code $Wc=2^{N-3}$ to the amplitude phase recorder 26.

The orthogonal signal generator 11 of the vector summed part 1 generates an I signal and a Q signal orthogonal to each other from a differential RF signal being an input signal, and outputs a differential I signal to the variable gain amplifier 13 and outputs a differential Q signal to the variable gain amplifier 14.

The sign signal and the gain $G_I(Wc)$ having been applied by the gain controller 22 are $P_I=1$ and $G_I(2^{N-3})=1/\sqrt{2}$, respectively. Therefore, upon receiving the differential I signal from the orthogonal signal generator 11, the variable gain amplifier 13 amplifies the I signal with the gain $1/\sqrt{2}$ without inverting the signs thereof, and outputs an amplified I signal to the signal combiner 15.

The sign signal and the gain $G_Q(Wc)$ having applied by the gain controller 22 are $P_Q=1$ and is $G_Q(2^{N-3})=1/\sqrt{2}$, respectively. Therefore, upon receiving the differential Q signal from the orthogonal signal generator 11, the variable gain amplifier 14 amplifies the received Q signal with the gain $1/\sqrt{2}$ without inverting the signs thereof, and outputs an amplified Q signal to the signal combiner 15.

Upon receiving the amplified differential I signal from the variable gain amplifier 13 and receiving the amplified differential Q signal from the variable gain amplifier 14, the signal combiner 15 combines the received I signal and Q signal, and outputs a combined signal for the I signal and the Q signal.

Upon receiving the combined signal from the signal combiner 15, the frequency converter 23 of the phase shift precision calibration circuitry 2 performs the downconversion on the frequency of the combined signal into an intermediate frequency, or the like.

The A/D converter 24 converts the combined signal whose frequency has been converted by the frequency converter 23 into a digital signal, and outputs the digital signal to an amplitude phase detector 25.

Upon receiving the digital signal from the A/D converter 24, the amplitude phase detector 25 detects a phase $\theta_{45}$ from the digital signal.

After the amplitude phase detector 25 detects the phase $\theta_{45}$ of the digital signal, the amplitude phase recorder 26 records a combination of the control code $Wc=2^{N-3}$ output from the gain controller 22 and the phase $\theta_{45}$.

Hereinafter, the phase $\theta_{45}$ obtained with the control code $Wc=2^{N-3}$ may be described as "phase $\theta_{45}$ $(2^{N-3})$".

The table calibrator 27 calculates, through the following Expression (18), a phase difference $\Delta\theta_4$ between the phase $\theta_I(0)$ and the phase $\theta_{45}(2^{N-3})$ by using the phase $\theta_I(0)$ at the phase shift amount of 0° and the phase $\theta_{45}(2^{N-3})$ at the phase shift amount of 45° recorded in the amplitude phase recorder 26.

$$\Delta\theta_4 = |\theta_I(0) - \theta_{45}(2^{N-3})| \tag{18}$$

After calculating the phase difference $\Delta\theta_4$, the table calibrator 27 calculates, through the following Expression (19), an error for an ideal value 45° of the phase difference $\Delta\theta_4$, that is, the phase shift error $\delta_1$. The table calibrator 27 records the calculated phase shift error $\delta_1$ to the amplitude phase recorder 26.

$$\delta_1 = \Delta\theta_4 - 45 \tag{19}$$

The table calibrator 27 calculates, through the following Expression (20), an amplitude ratio $A_{Q/I1}$ by using the phase shift errors $\alpha$, $\beta$, and $\delta_1$ recorded in the amplitude phase recorder 26, and records the calculated amplitude ratio $A_{Q/I1}$ to the amplitude phase recorder 26.

$$A_{Q/I1} = \frac{\tan\delta\sin\alpha - \cos\alpha}{\sin\beta - \tan\delta\cos\alpha} \tag{20}$$

The gain controller 22 of the phase shift precision calibration circuitry 2 refers to a table in the table memory 21 for acquiring the sign signals $P_I$ and $P_Q$ and the gains $G_I$ and $G_Q$ that are associated with the control code Wc corresponding to the phase shift amount of 225°.

Since the control code Wc corresponding to the phase shift amount of 225° is $2^{N-1}+2^{N-3}$, the gain controller 22 acquires $(P_I, P_Q)=(-1, -1)$ and $(G_I(2^{N-1}+2^{N-3}), G_Q(2^{N-1}+2^{N-3}))=(1/\sqrt{2}, 1/\sqrt{2})$ associated with $Wc=2^{N-1}+2^{N-3}$.

Upon acquiring the sign signals $(P_I, P_Q)=(-1, -1)$ and the gains $((G_I(2^{N-1}+2^{N-3}), G_Q(2^{N-1}+2^{N-3}))=(1/\sqrt{2}, 1/\sqrt{2})$, the gain controller 22 applies the sign signal $P_I=-1$ and the gain $G_I(2^{N-1}+2^{N-3})=1/\sqrt{2}$ to the variable gain amplifier 13 and also applies the sign signal $P_Q=-1$ and the gain $G_Q(2^{N-1}+2^{N-3})=1/\cdot 2$ to the variable gain amplifier 14. The gain controller 22 outputs the control code $Wc=2^{N-1}+2^{N-3}$ to the amplitude phase recorder 26.

The orthogonal signal generator 11 of the vector summed part 1 generates an I signal and a Q signal orthogonal to each other from a differential RF signal being an input signal, and outputs a differential I signal to the variable gain amplifier 13 and outputs a differential Q signal to the variable gain amplifier 14.

The sign signal and the gain $G_I$ (Wc) having been applied by the gain controller 22 are $P_I=-1$ and is $G_I(2^{N-1}+2^{N-3})=$ 1/$\sqrt{2}$, respectively. Therefore, upon receiving the differential I signal from the orthogonal signal generator 11, the variable gain amplifier 13 amplifies the received I signal with the gain 1/$\sqrt{2}$ and inverts the signs thereof, and outputs an inverted amplified I signal to the signal combiner 15.

The sign signal and the gain $G_Q$ (Wc) having been applied by the gain controller 22 are $P_Q=-1$ and $G_Q(2^{N-1}+2^{N-3})=1/\sqrt{2}$, respectively. Therefore, upon receiving the differential Q signal from the orthogonal signal generator 11, the variable gain amplifier 14 amplifies the received Q signal with the gain 1/$\sqrt{2}$ and inverts the signs thereof, and outputs an inverted amplified Q signal to the signal combiner 15.

Upon receiving the amplified differential I signal from the variable gain amplifier 13 and receiving the amplified differential Q signal from the variable gain amplifier 14, the signal combiner 15 combines the I signal and the Q signal, and outputs a combined signal for the I signal and the Q signal.

Upon receiving the combined signal from the signal combiner 15, the frequency converter 23 of the phase shift precision calibration circuitry 2 performs the downconversion on the frequency of the combined signal into an intermediate frequency, or the like.

The A/D converter 24 converts the combined signal whose frequency has been converted by the frequency converter 23 into a digital signal, and outputs the digital signal to an amplitude phase detector 25.

Upon receiving the digital signal from the A/D converter 24, the amplitude phase detector 25 detects a phase $\theta_{225}$ from the digital signal.

After the amplitude phase detector 25 detects the phase $\theta_{225}$ of the digital signal, the amplitude phase recorder 26 records a combination of the control code $Wc=2^{N-1}+2^{N-3}$ output from the gain controller 22 and the phase $\theta_{225}$.

Hereinafter, the phase $\theta_{225}$ obtained with the control code $Wc=2^{N-1}+2^{N-3}$ may be described as "$\theta_{225}(2^{N-1}+2^{N-3})$".

The table calibrator 27 calculates, through the following Expression (21), a phase difference $\Delta\theta_5$ between the phase $\theta_I(2^{N-1})$ and the phase $\theta_{225}(2^{N-1}+2^{N-3})$ by using the phase $\theta_I(2^{N-1})$ at the phase shift amount of 180° and the phase $\theta_{225}(2^{N-1}+2^{N-3})$ at the phase shift amount of 225° recorded in the amplitude phase recorder 26.

$$\Delta\theta_5 = |\theta_I(2^{N-1}) - \theta_{225}(2^{N-1}+2^{N-3})| \tag{21}$$

After calculating the phase difference $\Delta\theta_5$, the table calibrator 27 calculates, through the following Expression (22), an error for the ideal value 45° (=225°−180°) of the phase difference $\Delta\theta_5$, that is, the phase shift error $\delta_2$. The table calibrator 27 records the calculated phase shift error $\delta_2$ to the amplitude phase recorder 26.

$$\delta_2 = \Delta\theta_5 - 45 \tag{22}$$

The table calibrator 27 calculates, through the following Expression (23), an amplitude ratio $A_{Q/I2}$ by using the phase shift errors $\alpha$, $\gamma$, and $\delta_2$ recorded in the amplitude phase recorder 26, and records the amplitude ratio $A_{Q/I2}$ to the amplitude phase recorder 26.

$$A_{Q/I2} = \frac{\tan\delta\sin\alpha - \cos\alpha}{\sin\gamma - \tan\delta\cos\alpha} \tag{23}$$

The rest of the configuration is similar to that of the Embodiment 1, and thus the detailed description is omitted.

Similarly to the Embodiment 1, in the Embodiment 2 as well, the phase shift precision of the vector summed part 1 can be improved.

That is, according to the Embodiment 2, the relation between the control code Wc and the gains $G_I(Wc)$ and $G_Q(Wc)$ can be calibrated without adding a new circuit onto a signal line in the vector summed part 1. Therefore, the phase shift error associated with the manufacturing variation or the like can be eliminated without being affected by characteristic deterioration associated with the addition of a new circuit. As a result, the yield of the vector sum phase shifter can be increased.

Note that the invention of the present application allows free combinations of the embodiments, modifications of arbitrary configuration elements of the embodiments, or omissions of arbitrary configuration elements in the embodiments, within the scope of the invention.

The phase shift precision calibration circuitry according to the present invention is suitable for calibrating the phase shift precision of the vector sum phase shifter.

REFERENCE SIGNS LIST

1: Vector summed part, 2: Phase shift precision calibration circuitry, 11: Orthogonal signal generator, 12: Vector signal combiner, 13: Variable gain amplifier (First variable gain amplifier), 14: Variable gain amplifier (Second variable gain amplifier), 15: Signal combiner, 21: Table memory, 22: Gain controller, 23: Frequency converter, 24: A/D converter, 25: Amplitude phase detector (Detector), 26: Amplitude phase recorder (Recorder), 27: Table calibrator

The invention claimed is:

1. Phase shift precision calibration circuitry comprising:
    a table memory to store a relation between a control code corresponding to a phase shift amount and gains of variable gain amplifiers mounted in a vector sum phase shifter;
    a gain controller to apply the gains associated with the control code to the variable gain amplifiers;
    a detector to detect amplitude and a phase from an output signal of the vector sum phase shifter;
    a recorder to record, when the gains are applied by the gain controller, a combination of a control code corresponding to said gains and the amplitude and the phase detected by the detector; and
    a calibrator to find a phase shift characteristic of the vector sum phase shifter from records of the recorder and calibrate the relation between a control code and gains recorded in the table memory by using the phase shift characteristic.

2. A vector sum phase shifter comprising:
    a vector summed part including
        an orthogonal signal generator to generate, from an input signal, a first signal and a second signal which are orthogonal to each other,
        a first variable gain amplifier to amplify the first signal generated by the orthogonal signal generator,
        a second variable gain amplifier to amplify the second signal generated by the orthogonal signal generator, and
        a signal combiner to combine the first signal amplified by the first variable gain amplifier and the second signal amplified by the second variable gain amplifier and output a combined signal of the first signal and the second signal;
    a table memory to store a relation between a control code corresponding to a phase shift amount and gains of the first and second variable gain amplifiers;
    a gain controller to apply the gains associated with the control code to the first and second variable gain amplifiers;
    a detector to detect amplitude and a phase from the combined signal output by the signal combiner;
    a recorder to record, when the gains are applied by the gain controller, a combination of a control code corresponding to said gains and the amplitude and the phase detected by the detector; and
    a calibrator to find a phase shift characteristic of the vector summed part from records of the recorder and calibrate the relation between a control code and gains recorded in the table memory by using the phase shift characteristic.

3. The vector sum phase shifter according to claim 2, wherein
    the gain controller is configured to sequentially apply a plurality of gains as the gains to the first and second variable gain amplifiers, and
    the calibrator is configured to calculate, from the records of the recorder, a phase shift error between the first signal and the second signal and find the phase shift characteristic of the vector summed part from the calculated phase shift error and the records of the recorder.

4. A wireless communication device that mounts a vector sum phase shifter comprising:
    a vector summed part including
        an orthogonal signal generator to generate, from an input signal, a first signal and a second signal which are orthogonal to each other,
        a first variable gain amplifier to amplify the first signal generated by the orthogonal signal generator,
        a second variable gain amplifier to amplify the second signal generated by the orthogonal signal generator, and
        a signal combiner to combine the first signal amplified by the first variable gain amplifier and the second signal amplified by the second variable gain amplifier and output a combined signal of the first signal and the second signal;
    a table memory to store a relation between a control code corresponding to a phase shift amount and gains of the first and second variable gain amplifiers;
    a gain controller to apply the gains associated with the control code to the first and second variable gain amplifiers;
    a detector to detect amplitude and a phase from the combined signal output by the signal combiner;
    a recorder to record, when the gains are applied by the gain controller, a combination of a control code corresponding to said gains and the amplitude and the phase detected by the detector; and
    a calibrator to find a phase shift characteristic of the vector summed part from records of the recorder and calibrate the relation between a control code and gains recorded in the table memory by using the phase shift characteristic.

* * * * *